(12) United States Patent
Zhu et al.

(10) Patent No.: US 12,328,837 B2
(45) Date of Patent: Jun. 10, 2025

(54) CHASSIS ARCHITECTURE AND SERVER COMPRISING SAME

(71) Applicant: SUZHOU METABRAIN INTELLIGENT TECHNOLOGY CO., LTD., Jiangsu (CN)

(72) Inventors: Jingxian Zhu, Jiangsu (CN); Zhencai Cao, Jiangsu (CN); Zhanyang Li, Jiangsu (CN); Xiuzhong Yin, Jiangsu (CN)

(73) Assignee: SUZHOU METABRAIN INTELLIGENT TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 18/873,670

(22) PCT Filed: Aug. 31, 2023

(86) PCT No.: PCT/CN2023/116213
§ 371 (c)(1),
(2) Date: Dec. 10, 2024

(87) PCT Pub. No.: WO2024/146156
PCT Pub. Date: Jul. 11, 2024

(65) Prior Publication Data
US 2025/0169017 A1    May 22, 2025

(30) Foreign Application Priority Data
Jan. 4, 2023 (CN) .......................... 202310005573.2

(51) Int. Cl.
*H05K 7/20* (2006.01)
*G06F 1/18* (2006.01)
(Continued)

(52) U.S. Cl.
CPC .......... *H05K 7/1488* (2013.01); *G06F 1/189* (2013.01); *G06F 1/20* (2013.01); *H05K 7/20736* (2013.01)

(58) Field of Classification Search
CPC . G06F 1/185; G06F 1/20; G06F 1/187; G06F 13/4068; G06F 1/183;
(Continued)

(56) References Cited

U.S. PATENT DOCUMENTS 6,504,718 B2 *   1/2003   Wu ..................... H05K 7/20727
                                            174/15.1
7,408,773 B1 *   8/2008   Wobig ...................... G06F 1/20
                                            165/185
(Continued)

FOREIGN PATENT DOCUMENTS

CN    113359958 A    9/2021
CN    114253366 A    3/2022
(Continued)

OTHER PUBLICATIONS

International Search Report and Written Opinion for International Patent Application No. PCT/CN2023/116213 mailed Nov. 22, 2023, with English translation of Search Report.

*Primary Examiner* — Mandeep S Buttar
(74) *Attorney, Agent, or Firm* — Merchant & Gould P.C.

(57) ABSTRACT

A chassis architecture and a server comprising same. The chassis architecture includes: a PCIE module layer, a threading layer and a computing layer. The threading layer is provided with a plurality of first threading holes, allowing a passage of PCIE cables connected to PCIE modules; the upper surface of the threading layer is configured for bearing the PCIE cables; the computing layer is provided with a plurality of second threading holes, allowing a passage of the PCIE cables. Moreover, an upper surface of the threading layer is configured for bearing the PCIE cables, so that (Continued)

a plurality of PCIE modules may be arranged in one row, and thus each of the plurality of PCIE modules may meet the heat dissipation requirement thereof.

20 Claims, 10 Drawing Sheets

(51) Int. Cl.
    *G06F 1/20*     (2006.01)
    *H05K 7/14*     (2006.01)

(58) Field of Classification Search
    CPC ......... G06F 13/4282; G06F 2213/0026; G06F 1/181; G06F 13/4022; G06F 13/409; H05K 7/1417; H05K 7/1487; H05K 5/0217; H05K 7/026; H05K 7/20163; H05K 5/0269; H05K 5/0247
    USPC .................................................. 361/679.46
    See application file for complete search history.

(56) References Cited

U.S. PATENT DOCUMENTS

| | | | |
|---|---|---|---|
| 7,843,685 B2 * | 11/2010 | Beauchamp | G06F 1/20 361/679.48 |
| 9,058,159 B2 * | 6/2015 | Lee | G06F 1/181 |
| 2010/0265650 A1 | 10/2010 | Chen et al. | |
| 2014/0254097 A1 * | 9/2014 | Kohn | H05K 7/20154 361/697 |
| 2017/0024347 A1 * | 1/2017 | Dao | G06F 1/26 |
| 2024/0385662 A1 | 11/2024 | He et al. | |

FOREIGN PATENT DOCUMENTS

| | | |
|---|---|---|
| CN | 216412026 U | 4/2022 |
| CN | 115390639 A | 11/2022 |
| CN | 115509313 A | 12/2022 |
| CN | 115826699 A | 3/2023 |
| WO | 2022111589 A1 | 6/2022 |
| WO | 2024146156 A1 | 7/2024 |

* cited by examiner

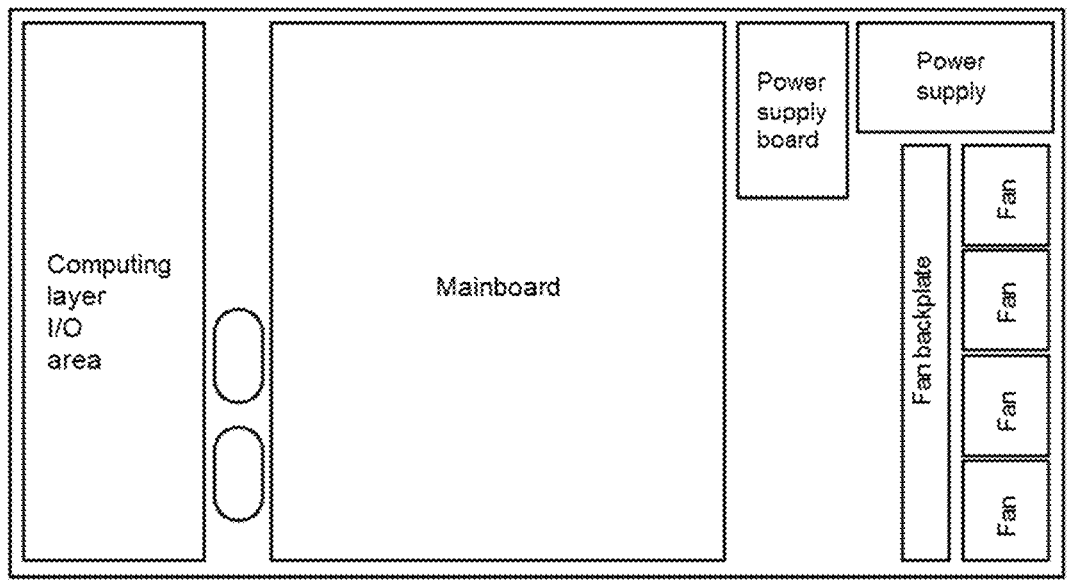
Fig. 1
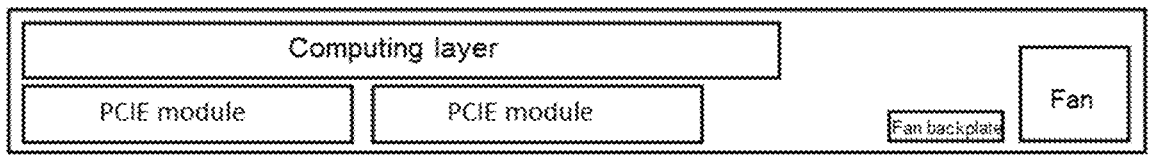
Fig. 2
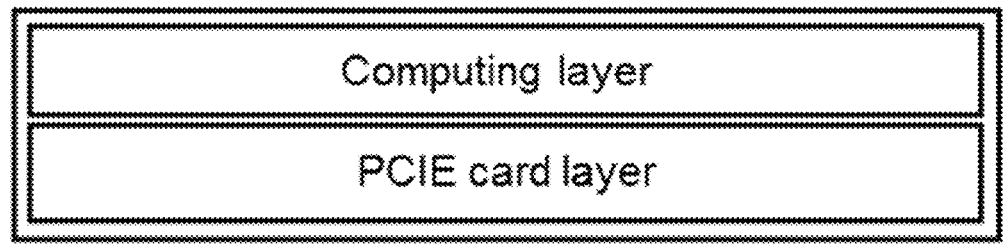
Fig. 3
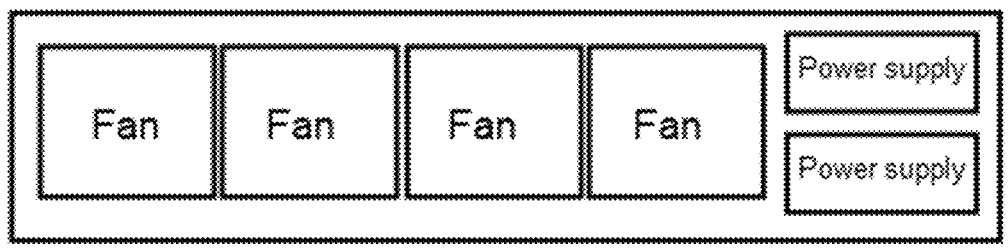
Fig. p4

CHASSIS ARCHITECTURE AND SERVER COMPRISING SAME

CROSS-REFERENCE TO RELATED APPLICATIONS

The present application is a National Stage Application of PCT International Application No.: PCT/CN2023/116213 filed on Aug. 31, 2023, which claims priority to Chinese Patent Application 202310005573.2, filed in the China National Intellectual Property Administration on Jan. 4, 2023, the disclosure of which is incorporated herein by reference in its entirety.

TECHNICAL FIELD

The disclosure relates to the technical field of servers, and in particular, to a chassis architecture and a server comprising same.

BACKGROUND

In an I/O-type server, a PCIE-type GPU (Graphic Processing Unit) card, a FPGA (Field Programmable Gate Array) card, an encryption card, etc. need to installed in a chassis. Generally, these cards have two heat dissipation manners: a passive heat dissipation PCIE module and an active heat dissipation PCIE module. The active heat dissipation PCIE module carries a heat dissipation fan, while the passive heat dissipation PCIE module only use an on-board radiator to assist in dissipating heat.

As shown in FIGS. 1 to 4, existing I/O servers use "front-and-rear row" layout, which is generally a manner of arranging three PCIE modules in a row and arranging one PCIE module in another row, that is, there is one row of PCIE modules at a panel, and a second row of PCIE modules are placed inside a chassis. However, with the layout in this manner, PCIE modules at the rear end do not receive cool air from the panel, and as the power of the PCIE modules increases, the heat dissipation of the PCIE modules at the rear end in this layout may not satisfy the heat dissipation requirement of the PCIE modules; since the second row of PCIE modules are embedded in the chassis, there is a problem that an external I/O may not be connected; when a front-end PCIE Riser (riser card) threads to a computing layer, the uplifting of the computing layer and the threading need a cooperative operation of multiple persons, two persons are required to uplift the computing layer, and one person performs the threading operation, which has a high requirement on human power; in addition, the active heat dissipation PCIE module usually suck cool air from the tail and export air from one end of a baffle; a closed cavity is not formed at a position where the PCIE modules are installed, and therefore this layout may not be compatible with the active heat dissipation PCIE module.

SUMMARY

Some embodiments of the disclosure provide a chassis architecture and a server including same for any of the described technical problems, so as to solve the technical problems that the requirement for human power is high and the heat dissipation of the PCIE modules at the rear end may not meet the heat dissipation requirement thereof, which are caused by the fact that it is difficult in threading due to a "front-and-rear row" layout of the current I/O-type servers.

In an embodiment of the disclosure, a chassis architecture is provided. The chassis architecture includes:
a PCIE module layer, including a bottom plate and two side plates connected to two sides of the bottom plate, a PCIE module installing area and a fan installing area being respectively provided at two ends of the bottom plate in an extending direction of the bottom plate, and the PCIE module installing area being configured for accommodating a plurality of PCIE modules;
a threading layer, provided above the PCIE module layer and corresponding to the PCIE module installing area, two sides of the threading layer being connected to the two side plates, the threading layer being provided with a plurality of first threading holes, the plurality of first threading holes being configured for allowing a passage of a PCIE cable connected to the PCIE module, and an upper surface of the threading layer being configured for bearing the PCIE cable; and
a computing layer, provided above the threading layer, two sides of the computing layer being connected to the two side plates, the computing layer being provided with a mainboard installing area and a power supply installing area, the computing layer being provided with a plurality of second threading holes, and the plurality of second threading holes being configured for allowing the passage of the PCIE cable, so that the PCIE cable extends to the mainboard installing area and/or the power supply installing area.

In some embodiments, the threading layer includes a fixing tray, the fixing tray is parallel to the bottom plate, and two sides of the fixing tray are connected to the two side plates by clamping.

In some embodiments, two sides of the fixing tray are provided with L-shaped grooves; the two side plates are provided with I-shaped nails, and the L-shaped grooves are fitted with the I-shaped nails.

In some embodiments, a fixing tray includes two first threading holes parallel to each other, and an extending direction of the two first threading holes is perpendicular to an extending direction of the bottom plate.

In some embodiments, temporary cable storage structures are provided at two sides of each of the plurality of first threading holes, and/or temporary cable storage structures are provided on a fixing tray at a position corresponding to each of the plurality of second threading holes, and the temporary cable storage structures include cable clamps.

In some embodiments, edges of the plurality of first threading holes are provided with flexible seals extending to the central position of the plurality of first threading holes, and gaps between the flexible seals pass through the PCIE cable; and the flexible seals include a foam strip, a fur brush, a rubber block or an elastic fabric strip.

In some embodiments, the PCIE module layer further includes an external outer end plate and an inner end plate that are located at two sides of the PCIE module installing area, bottom edges of the external outer end plate and the inner end plate are both connected to the bottom plate, and two ends of the external outer end plate and two ends of the inner end plate are both connected to the two side plates, a top edge of the external outer end plate is connected to the computing layer, and a top edge of the inner end plate is connected to the threading layer, so that the PCIE module installing area between the threading layer and the bottom plate forms a closed cavity.

In some embodiments, a plurality of PCIE module fixing slots provided in parallel are provided in the PCIE module installing area, and each of the plurality of PCIE module fixing slots is arranged in an extending direction of the bottom plate and is capable of accommodating each of the plurality of PCIE modules, and all of the plurality of PCIE module fixing slots are aligned with each other in an extending direction perpendicular to the extending direction of the bottom plate.

In some embodiments, an external outer end plate is provided with connection ports corresponding to each of the plurality of PCIE module fixing slots; each of the connection ports is able to snap-fit a baffle or an end blocking plate of the PCIE module; and the inner end plate is provided with snap-fit ports which are arranged in a one-to-one correspondence with the connection ports.

In some embodiments, the plurality of PCIE modules include an active heat dissipation PCIE card and a passive heat dissipation PCIE card; two ends of each of the plurality of PCIE modules are respectively provided with an end blocking plate and a card tail fixing support;
- when the passive heat dissipation PCIE card is provided in a PCIE module fixing slot, the connection port accommodates the end blocking plate of the passive heat dissipation PCIE card;
- when no passive heat dissipation PCIE card is provided in a PCIE module fixing slot, a baffle is snap-fitted to a connection port corresponding to the PCIE module fixing slot;
- when the active heat dissipation PCIE card is provided in a PCIE module fixing slot, the active heat dissipation PCIE card and a connection port corresponding to the PCIE module fixing slot are arranged at intervals, a baffle is snap-fitted to the connection port, an air inlet hole is provided on the baffle, and the snap-fit port fixes the card tail fixing support of the active heat dissipation PCIE card; and
- when no PCIE module is provided in the PCIE module fixing slot, a baffle is snap-fitted to both the connection port and the snap-fit port corresponding to the PCIE module fixing slot.

In some embodiments, the chassis architecture includes an air guide hood, and when both the active heat dissipation PCIE card and the passive heat dissipation PCIE card are provided in the PCIE module fixing slot in the PCIE module installing area, the air guide hood is provided between a card tail fixing support of the passive heat dissipation PCIE card and the snap-fit port.

In some embodiments, two sides of the computing layer are provided with L-shaped grooves; the two side plates are provided with I-shaped nails, and the L-shaped grooves are fitted with the I-shaped nails.

In some embodiments, the computing layer is provided with an I/O module installing area; the I/O module installing area is located on a side of the mainboard installing area away from the power supply installing area; a second threading hole is provided between the I/O module installing area and the mainboard installing area; and a second threading hole is provided between the mainboard installing area and the power supply installing area.

In another embodiment of the disclosure, a server is provided, the server including the chassis architecture above.

In some embodiments, the server includes:
- the plurality of PCIE modules, provided in the PCIE module installing area;
- fan modules, provided in a fan PCIE module installing area of the PCIE module layer;
- a mainboard, provided in the mainboard installing area of the computing layer;
- a power supply unit, provided in the power supply installing area of the computing layer;
- the PCIE cable, an end of which is electrically connected to the plurality of PCIE modules, and another end of which passes through the plurality of first threading holes of the threading layer, then extends along an upper surface of the threading layer and passes through the plurality of second threading holes of the computing layer to be electrically connected to the mainboard or the power supply unit; and
- a fan wiring, an end of which is electrically connected to the power module, and the other end of which passes through the plurality of second threading holes of the computing layer and is electrically connected to the mainboard or the power module.

In some embodiments, the plurality of PCIE modules are aligned with each other in the PCIE module installing area; and the plurality of PCIE module includes a Graphic Processing Unit (GPU) card, a Field Programmable Gate Array (FPGA) card, and an encryption card.

In some embodiments, each of the plurality of PCIE modules includes a fixed housing, and an end blocking plate and a card tail fixing support that are connected to two ends of the fixed housing; the end blocking plate is provided with a positioning pin and a handle; the positioning pin is in positioning snap-fit with a snap-fit port of the PCIE module installing area; the handle is rotatably provided on the top of the end blocking plate; the bottom of the card tail fixing support is provided with a knurled screw, and the knurled screw is in threaded connection with a threaded hole of the PCIE module installing area.

In some embodiments, the PCIE module includes:
- a riser card bracket, the riser card bracket being provided at a position of an outer side wall of each of the plurality of PCIE modules, two ends of the riser card bracket being respectively fixed to the end blocking plate and the card tail fixing support; when two PCIE modules are adjacently arranged, two riser card brackets are arranged up and down in a staggered manner;
- a riser card, provided on the riser card bracket; and
- a Mylar, provided on the side of the riser card away from the riser card bracket.

In some embodiments, the riser card bracket is L-shaped; the riser card bracket includes a fixing plate and a wire separation plate that are provided perpendicular to each other; the fixing plate is arranged parallel to an outer side wall of each of the plurality of PCIE modules; the wire separation plate is arranged perpendicular to the outer side wall of each of the plurality of PCIE modules; when two PCIE modules are arranged adjacent to each other, two wire separation plates are arranged parallel to each other vertically; and cables connected to the riser card are arranged on a side of two wire separation plates facing away from each other.

In some embodiments, the fan module includes a fan backplate and a fan unit; the power supply unit includes a power supply board and a power supply unit; the PCIE cable is electrically connected to the power supply board; the fan wiring is electrically connected between the fan backplate and the mainboard, and/or the fan wiring is electrically connected between the fan backplate and the power supply board.

BRIEF DESCRIPTION OF THE DRAWINGS

To describe the technical solutions in the embodiments of the present invention more clearly, the following briefly describes the accompanying drawings required for describing the embodiments. Apparently, the accompanying drawings in the following description show merely some embodiments of this application, and a person of ordinary skill in the art may still derive other accompanying drawings from these accompanying drawings without creative efforts.

FIG. 1 is a top view of the architecture of an I/O-type server in the related art;

FIG. 2 is a side view of the architecture of an I/O-type server in the related art;

FIG. 3 is a left view of the architecture of an I/O-type server in the related art;

FIG. 4 is a right view of the architecture of an I/O-type server in the related art;

The signs in the figure are as follows:

Figure 5:
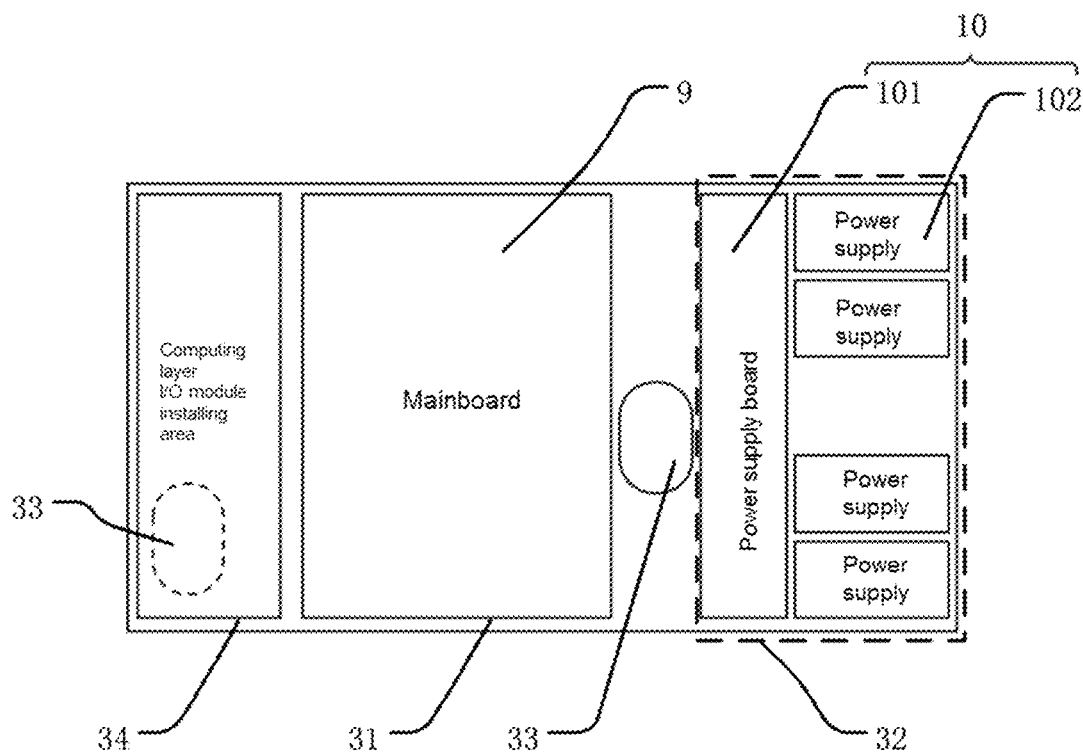
FIG. 5 is a top view of the architecture of an I/O server according to an embodiment of the disclosure.

PCIE module layer 1, bottom plate 11, PCIE module installing area 111, fan installing area 112, side plate 12, I-shaped nail 121, external outer end plate 13, connection port 131, inner end plate 14, snap-fit port 141, baffle 15, threading layer 2, fixing tray 20, first threading hole 21, temporary cable storage structure 22, L-shaped groove 201, computing layer 3, mainboard installing area 31, power supply installing area 32, second threading hole 33, I/O module installing area 34, upper cover 4, flexible sealer 5, PSU air guide hood 6, PCIE module 7, fixed housing 70, end blocking plate 71, positioning pin 711, handle 712, card tail fixing support 72, knurled screw 721, air guide hood 73, riser card bracket 74, fixing plate 741, wire separation plate 742, riser card 75, mylar 76, active heat dissipation PCIE card 701, passive heat dissipation PCIE card 702, fan module 8, fan backplate 81, fan unit 82, mainboard 9, power supply unit 10, power supply board 101, power supply unit 102.

DETAILED DESCRIPTION OF THE EMBODIMENTS

To make the objectives, technical solutions, and advantages of the disclosure clearer, the disclosure is further described in details below in combination with the drawings and embodiments. It should be understood that the specific embodiments described herein are only configured to explain the disclosure, and are not intended to limit the disclosure.

In the description of the disclosure, it should be understood that the terms "first" and "second" are only configured for descriptive purposes, and may not be understood as indicating or implying relative importance or implicitly indicating the number of indicated technical features. Thus, features defined by "first" and "second" may explicitly or implicitly include one or more of the features. In the description of the disclosure, "a plurality of" refers to two or more than two, unless specified otherwise.

In the description of the disclosure, it should be noted that, unless stated and limited otherwise, terms "installing", "connected", and "connection" should be understood in broader sense. For example, connection may be a fixed connection, a removable connection, or an integrated connection, may be a mechanical connection, an electrical connection, and may be a direct connection, an indirect connection through a medium, or a communication connection between two components or an interaction connection between two components, unless limited otherwise. For those of ordinary skill in the art, the specific meanings of the above terms in the disclosure may be understood according to specific situations.

In the disclosure, unless specified or limited otherwise, a first feature being "above" or "below" a second feature may include a direct contact between the first feature and the second feature, and may also include another feature contact between the first feature and the second feature rather than a direct contact. In addition, the first feature being "above", "over", and "on" the second feature includes the first feature being right above and obliquely above the second feature or only refers to the first feature being at a higher horizontal level than the second feature. The first feature being "below", "underneath", and "under" the second feature includes the first feature being right below and obliquely below the second feature or only refers to the first feature being at a lower horizontal level than the second feature.

The following disclosure provides many different embodiments or examples for implementing different structures of the present disclosure. In order to simplify the disclosure, components and settings of specific examples are described below. Of course, they are merely examples and are not intended to limit the disclosure.

Embodiment 1

As shown in FIGS. 1-4, the existing server architectures use a "front-and-rear row" layout, and a PCIE card at the rear end does not receive cold air from a panel, and as the power of the PCIE card increases, the heat dissipation of a fourth card in this layout may not meet the requirements; since the second row of PCIE cards are embedded in the chassis, there is a problem that an external I/O may not be connected; when a front-end PCIE Riser (riser card 75) threads to a computing layer 3, the uplifting of the computing layer 3 and the threading need a cooperative operation of multiple persons; in addition, the PCIE cards which actively dissipate heat usually suck cool air from the tail and export air from one end of the baffle; a closed cavity is not formed at the position where the PCIE cards are installed, and therefore this layout may not be compatible with the PCIE cards which actively dissipate heat.

Figure 6:
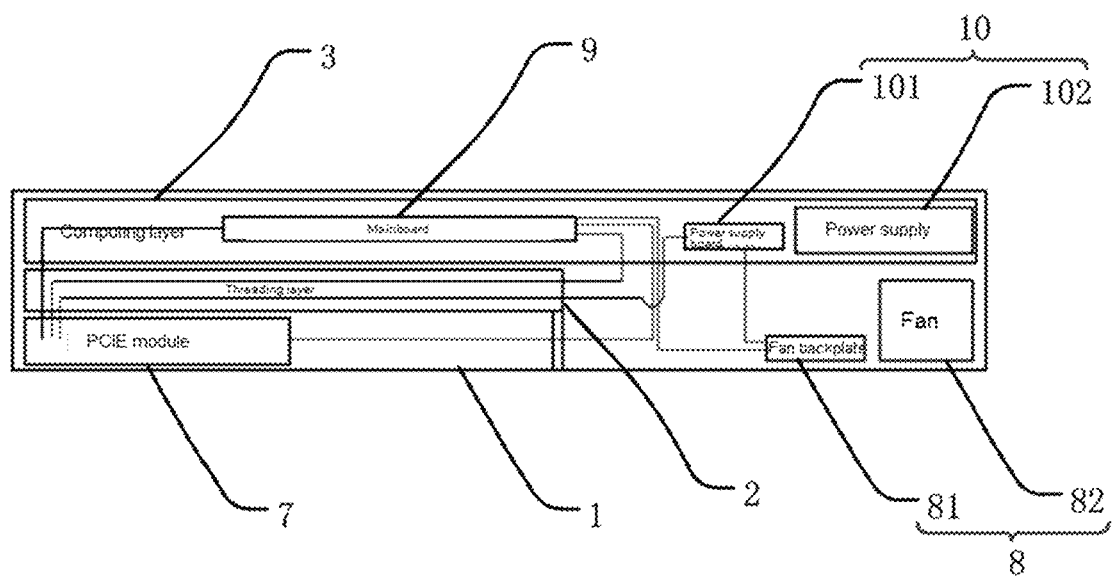
FIG. 6 is a side view of the architecture of an I/O-type server according to an embodiment of the disclosure.
Figure 7:
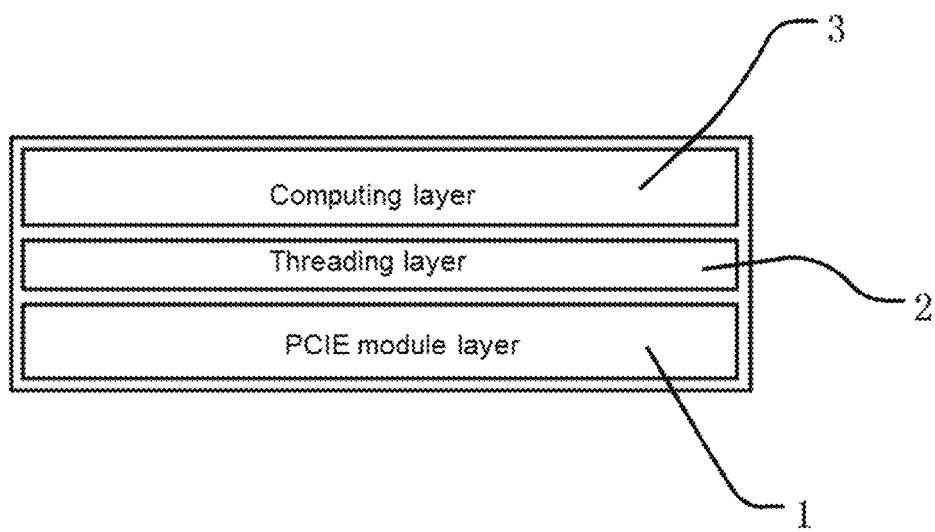
FIG. 7 is a left view of the architecture of an I/O server according to an embodiment of the disclosure.
Figure 9:
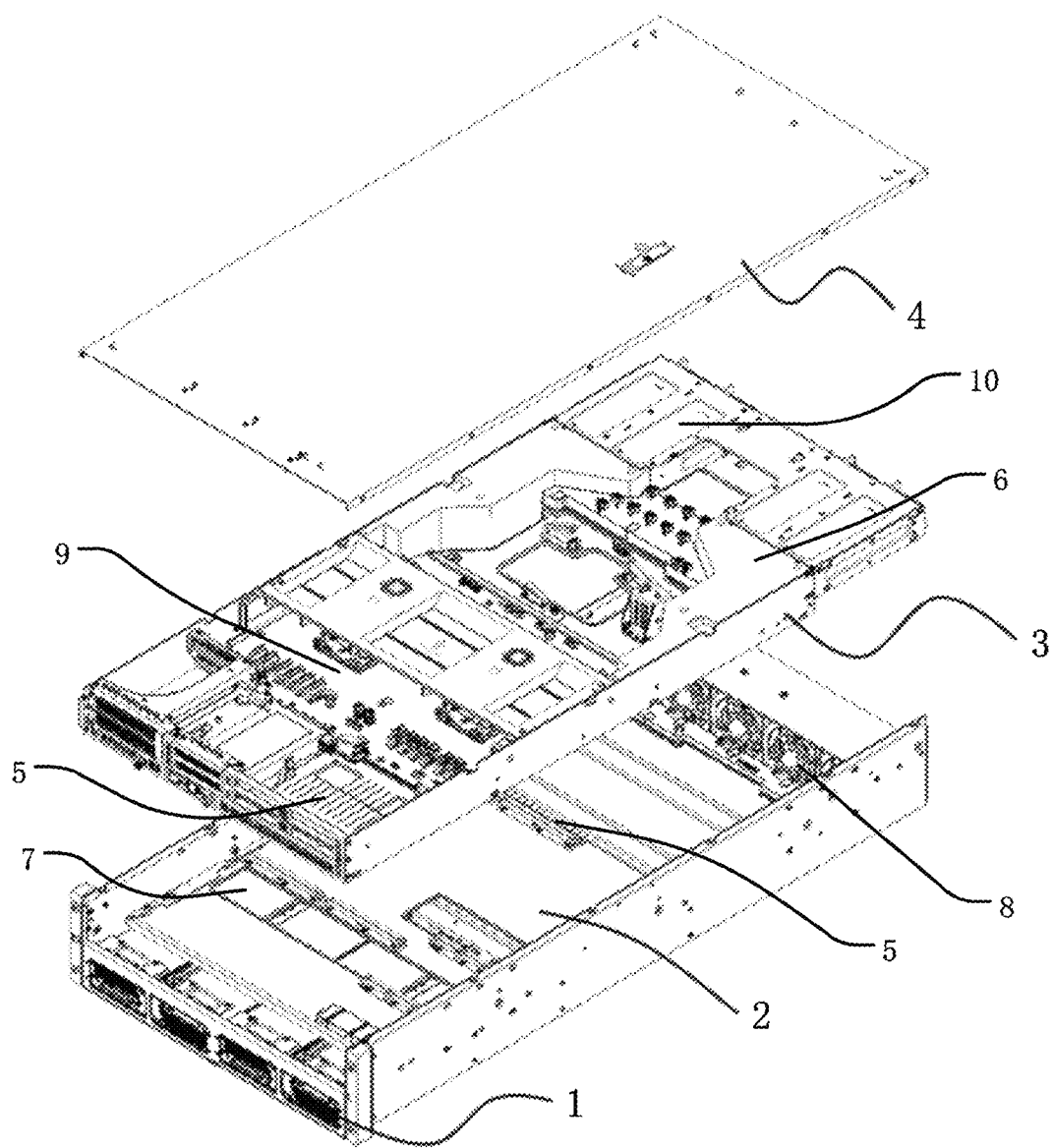
FIG. 9 is an exploded view of an I/O server according to an embodiment of the disclosure.
Figure 10:
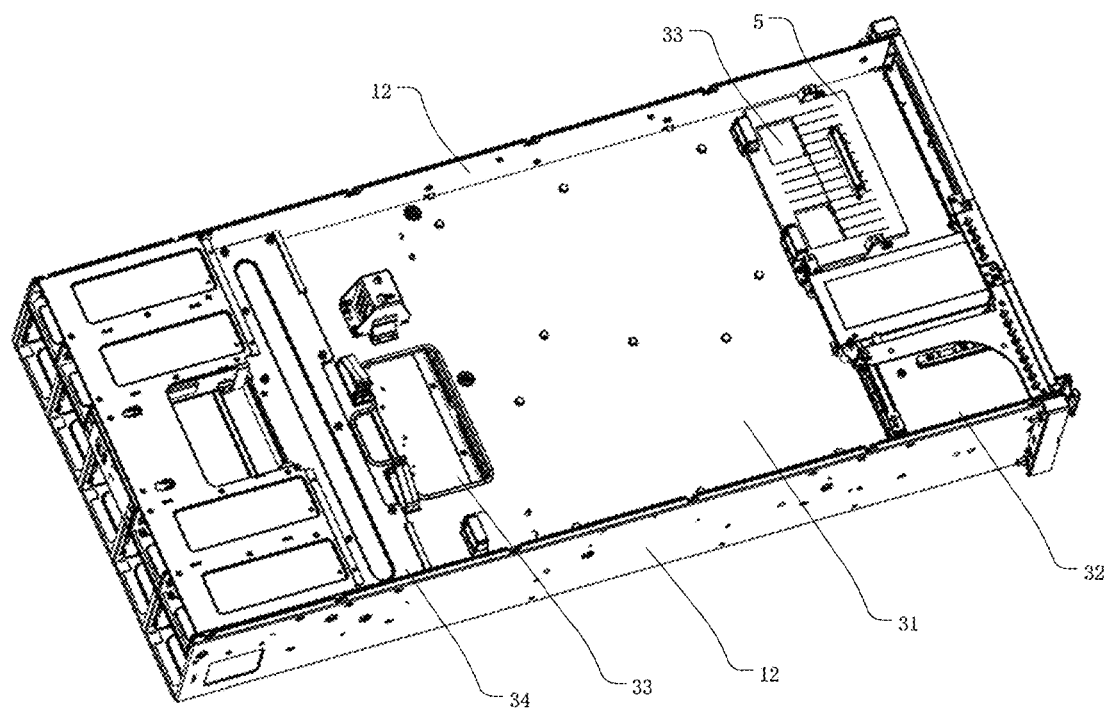
FIG. 10 is an overall schematic structural diagram of a chassis architecture according to an embodiment of the disclosure.
Figure 11:
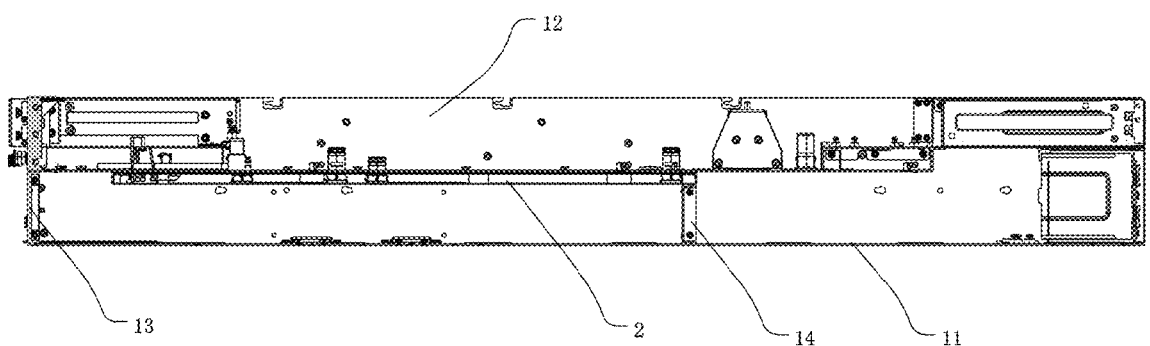
FIG. 11 is a sectional view of a chassis architecture according to an embodiment of the disclosure.
Figure 12:
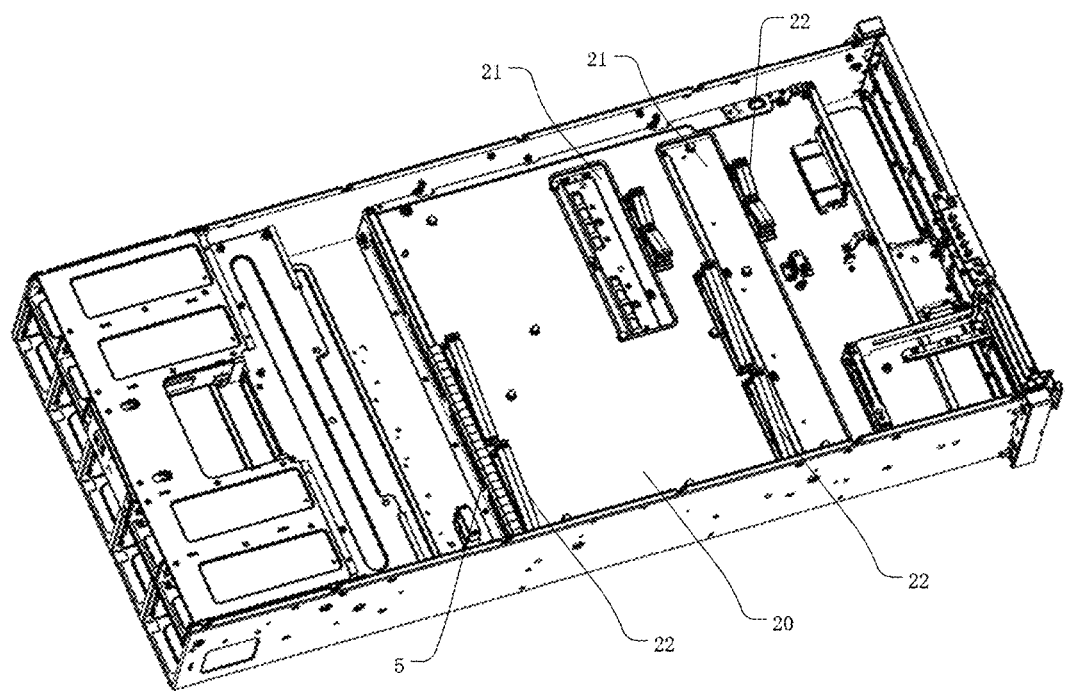
FIG. 12 is a partial schematic structural diagram of a chassis architecture according to an embodiment of the disclosure.
Figure 13:
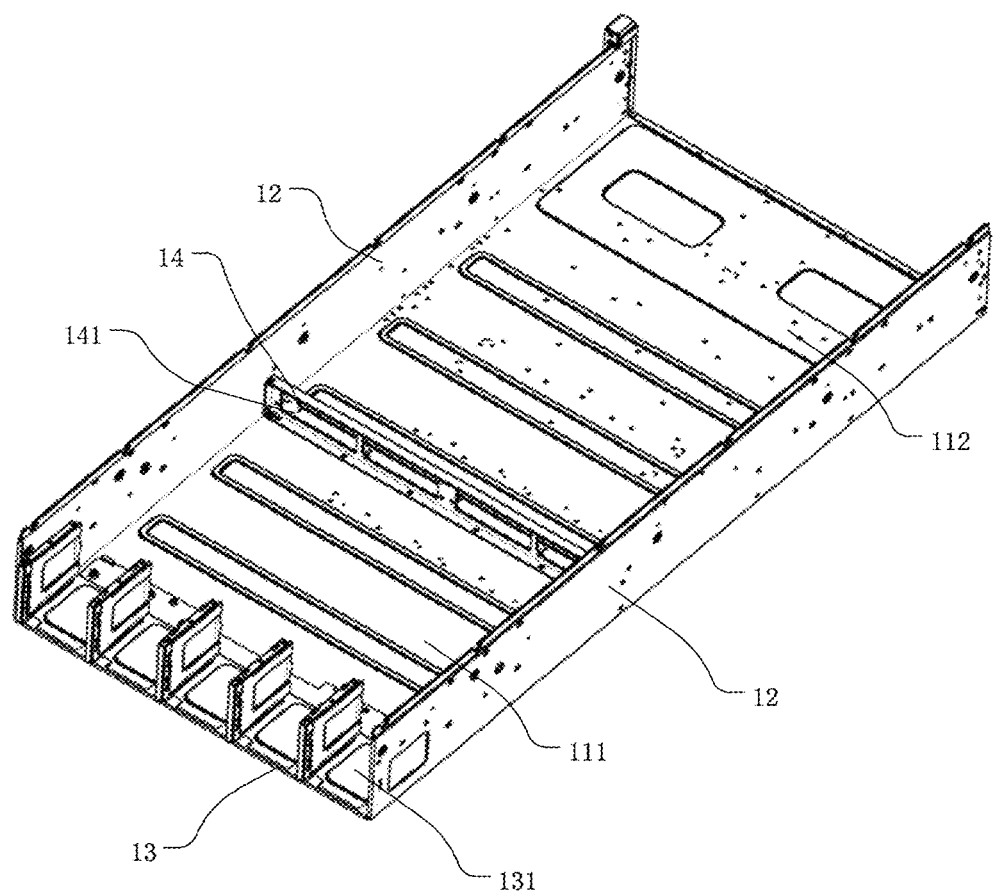
FIG. 13 is a schematic structural diagram of a PCIE module layer according to an embodiment of the disclosure.

In order to solve the described problems, as shown in FIGS. 6, 7 and 9, an embodiment of the disclosure creatively provides a chassis architecture, which is divided into a computing layer 3, a threading layer 2 and a PCIE module layer 1. The chassis architecture is applicable to servers.

As shown in FIGS. 9-15, the computing layer 3 is fitted with an I-shaped nail 121 of the chassis by means of L-shaped grooves 201 on both sides of a base, and is locked to the chassis architecture by means of a screw. The computing layer 3 includes an I/O module of a front window, a mainboard 9 in the middle, and a power supply unit (PSU) 10 and a unique identifier (UID) of a rear window. Threading holes are provided between the I/O module and the mainboard 9 and between the mainboard 9 and the rear window, and flexible seals 5 made of foam or other materials are pasted at positions needed to seal an air duct of the threading holes. A PSU air guide hood 6 takes cool air from the front end of the mainboard 9 and is fixed by means of the I-shaped nails 121 and positioning pins 711 without tools.

Figure 14:
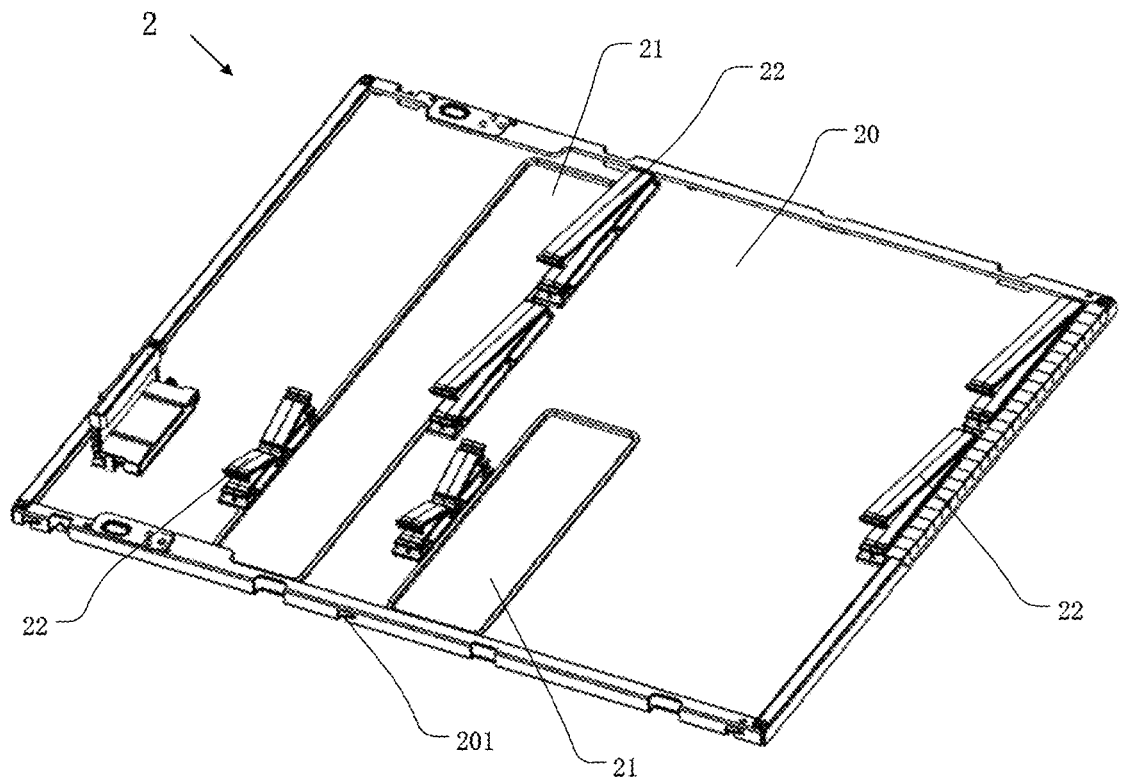
FIG. 14 is a schematic structural diagram of a threading layer according to an embodiment of the disclosure.

As shown in FIGS. 9 and 14, the threading layer 2 is designed with a fixing tray 20; L-shaped grooves 201 are provided on both sides of the fixing tray 20 to be fitted with the I-shaped nails 121 of the chassis architecture; and the fixing tray is fixed on the chassis architecture by means of hooks without tools. The fixing tray 20 is designed with a cable via hole, a temporary cable storage structure 22, and flexible seals 5 such as foams for sealing the air duct.

Figure 16:
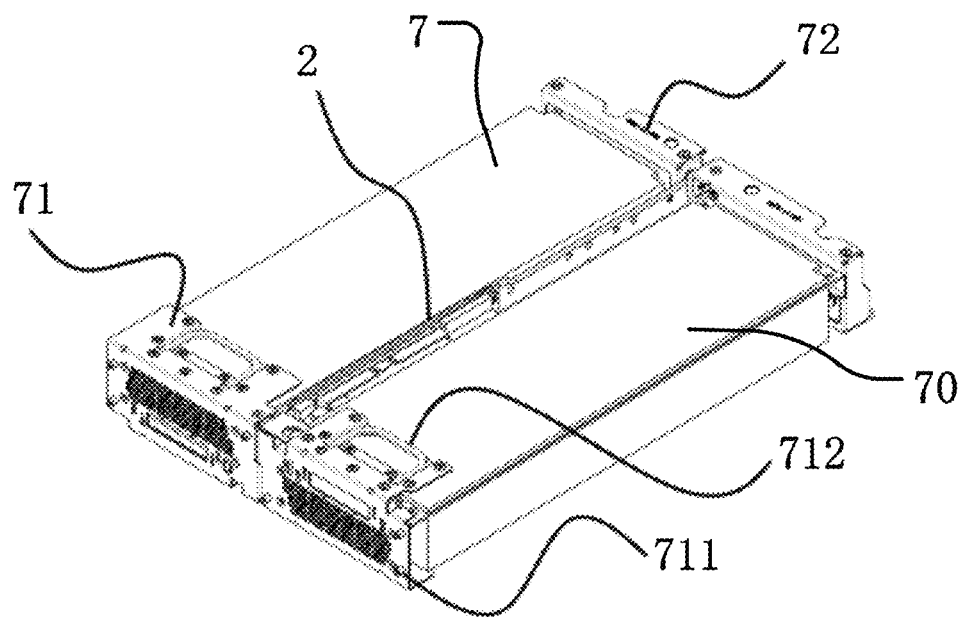
FIG. 16 is a schematic diagram of a connection structure of two PCIE modules according to an embodiment of the disclosure.
Figure 17:
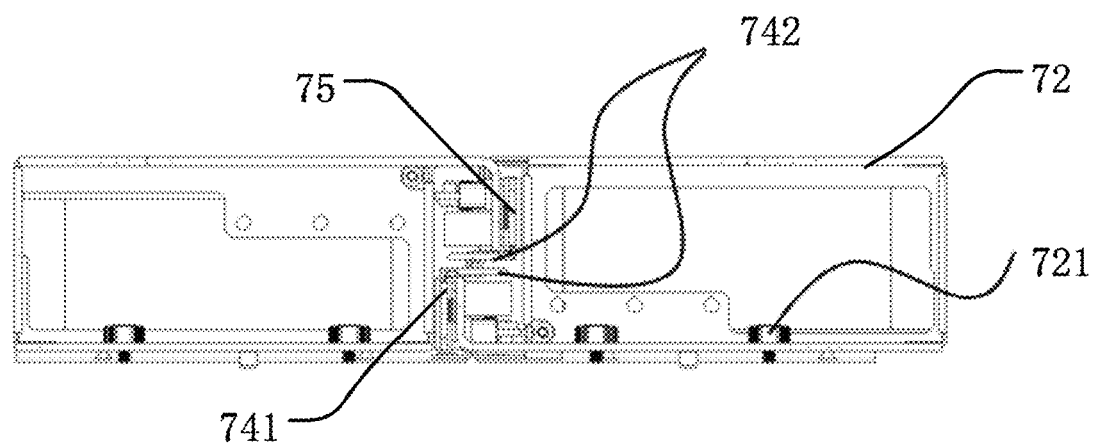
FIG. 17 is a sectional view of a connection structure of two PCIE modules according to an embodiment of the disclosure.
Figure 18:
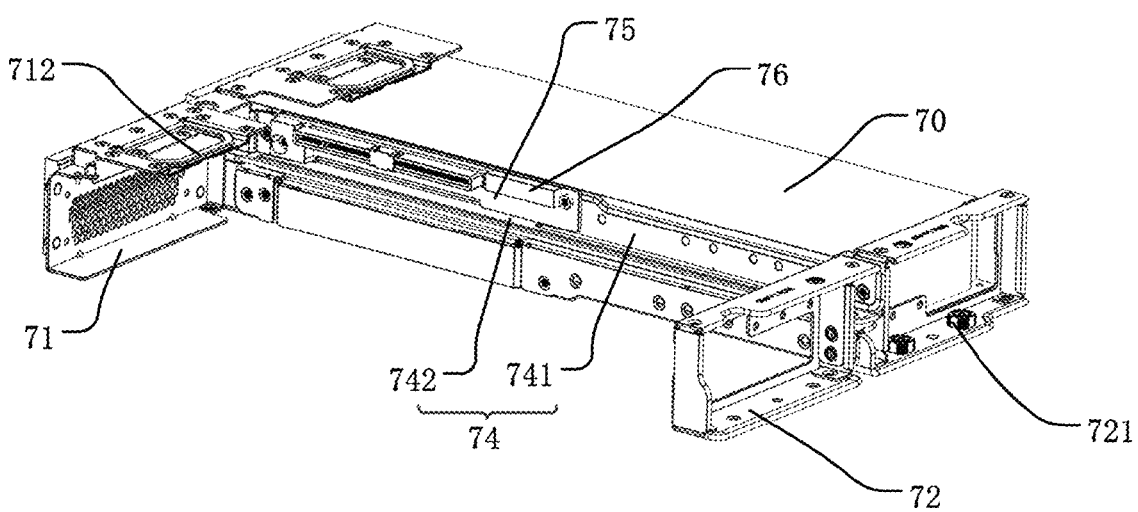
FIG. 18 is a partial schematic structural diagram of a connection structure of two PCIE modules according to an embodiment of the disclosure.

As shown in FIGS. 16-18, an end blocking plate 71 is designed on a PCIE module 7, positioning pins 711 and a handle 712 are designed on the end blocking plate 71, and knurled screws 721 without tools are designed on a card tail fixing support 72 for fixing. A riser card 75 (PCIE Riser) is fixed on a riser card bracket 74; the riser card bracket 74 is fixed on the end blocking plate 71 and the card tail fixing support 72; the riser card bracket 74 is L-shaped and includes a fixing plate 741 and a wire separation plate 742 perpendicular to each other; the wire separation plate 742 separates the cables coming out from the riser card 75, so as to prevent the riser card 75 and the cables from being scratched and damaged when the PCIE module 7 is assembled and maintained, thereby improving the operational experience. A mylar 76 preventing short circuit and scratch is attached to the board of the riser card 75. The end blocking plate of the PCIE module 7 is designed with the positioning pins 711, which is in positioning snap-fit with the snap-fit port of a chassis panel or a cross beam (a PCIE module installing area 111); the card tail fixing support of the PCIE module 7 is designed with knurled screws 721 which is fitted with chassis nuts to fix the PCIE module 7. The PCIE modules 7 are aligned with each other in the chassis, and the PCIE module 7 includes an active heat dissipation PCIE card 701 and a passive heat dissipation PCIE card 702; in an embodiment, a row of passive heat dissipation PCIE cards 702 is installed. Assuming that no card is installed in another PCIE module fixing slot, a baffle 15 (PCIE Dummy) is designed to perform cavity air duct sealing and EMC protection. In an embodiment, the passive heat dissipation PCIE card 702 and the active heat dissipation PCIE card 701 are installed in the chassis architecture at the same time, a wind guiding cover 73 needs to be installed at the tail of the passive heat dissipation card, thereby avoiding the problem of hot air flowing back out of the passive heat dissipation PCIE card 702.

The PCIE module 7 in an embodiment of the disclosure is designed with a handle 712, a riser card 75, a mylar 76 preventing short circuit and scratch pasted on the riser card 75, and a riser card bracket 74 for separating cables of two adjacent riser cards 75, thereby facilitating assembly and maintenance, reducing the risk of damaging the PCIE module 7 and the cables during assembly, and improving the operational experience. The threading layer 2 is designed with a temporary cable storage structure 22, so as to avoid that the assembly or maintenance operations may be completed by a plurality of people.

Figure 19:
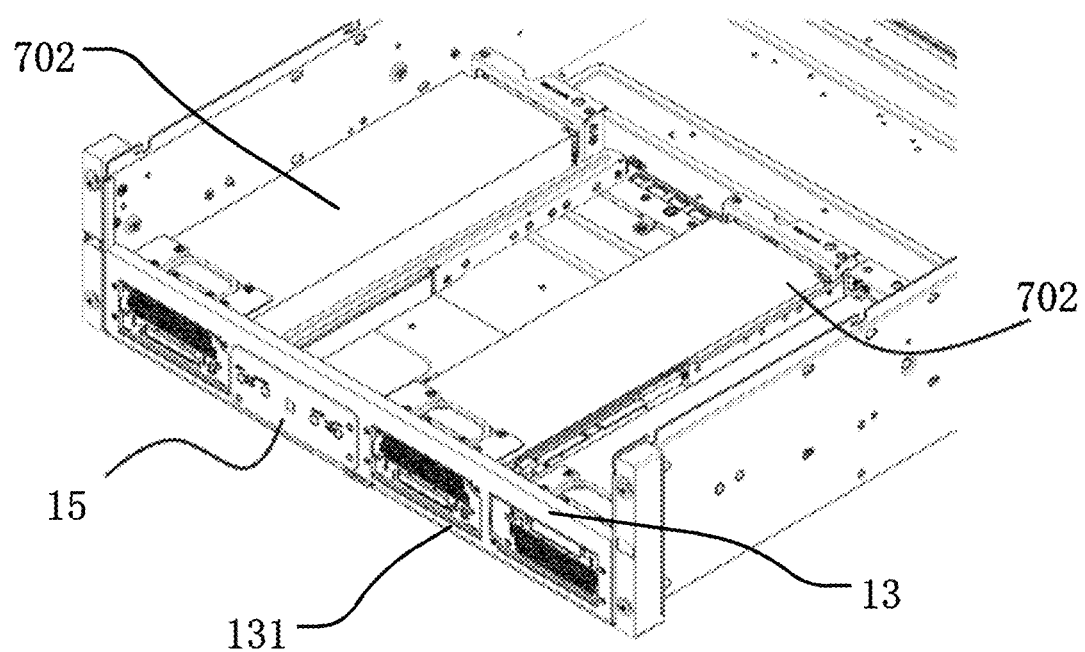
FIG. 19 is a schematic structural diagram of installing a passive heat dissipation PCIE card and a baffle on a PCIE module layer according to an embodiment of the disclosure.
Figure 20:
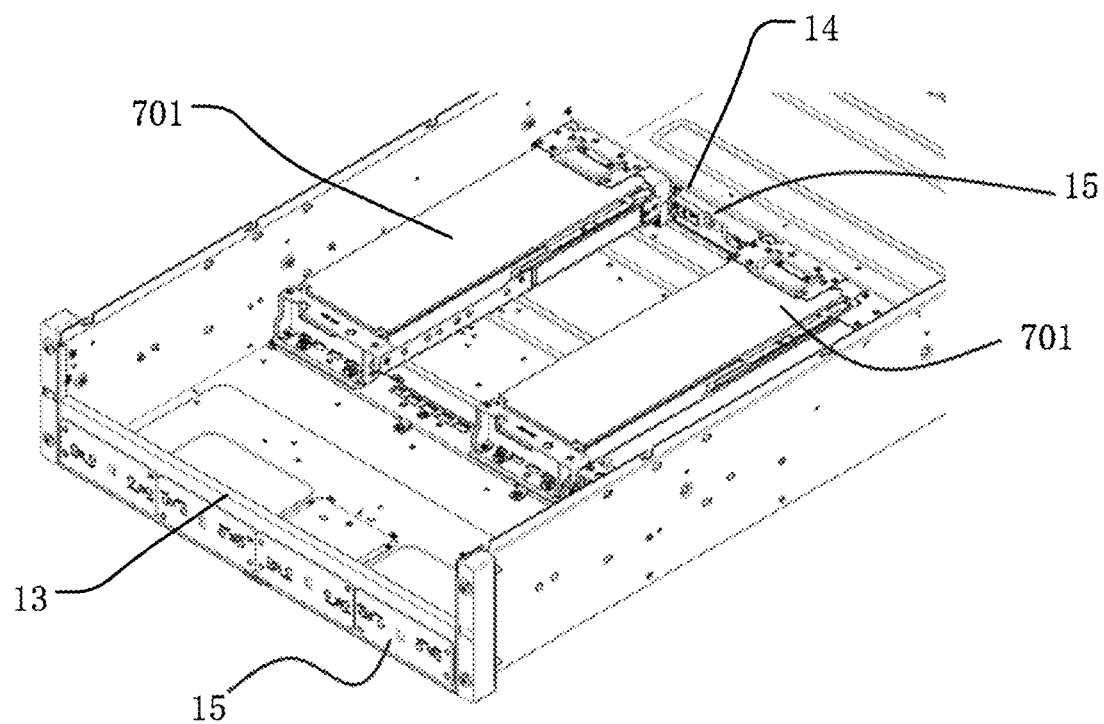
FIG. 20 is a schematic structural diagram of installing an active heat dissipation PCIE card and a baffle on a PCIE module layer according to another embodiment of the disclosure.
Figure 21:
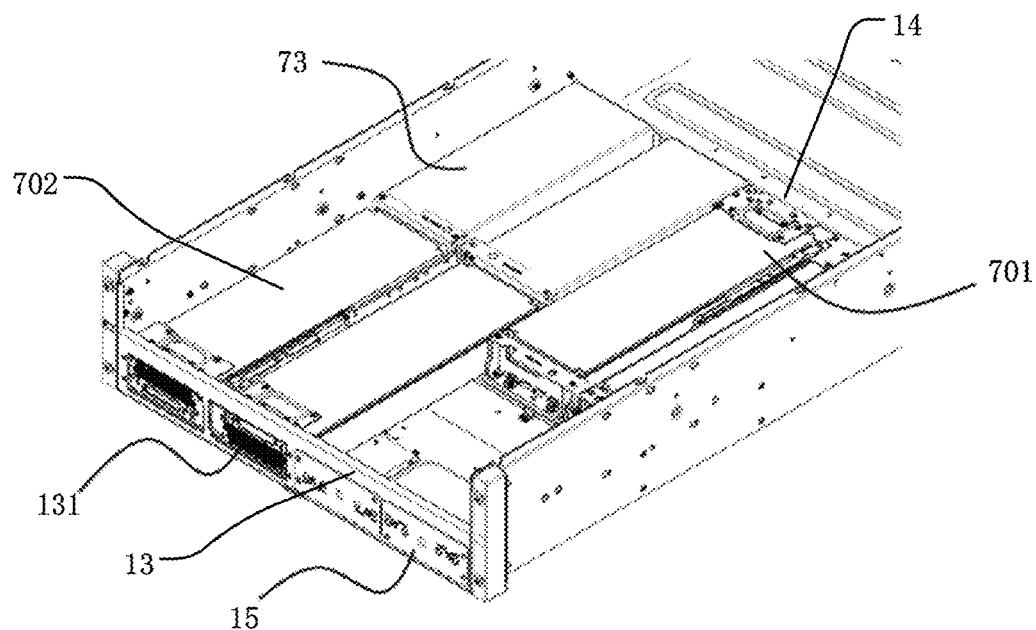
FIG. 21 is a schematic structural diagram of mixed insertion of a passive heat dissipation PCIE card and an active heat dissipation PCIE card on a PCIE module layer according to still another embodiment of the disclosure.

In another embodiment of the disclosure, also provided is a server which is a front-outlet I/O server, including a chassis architecture. As shown in FIGS. 19, 20 and 21, the server is able to be compatible with both the active heat dissipation PCIE card 701 and the passive heat dissipation PCIE card 702.

Figure 8:
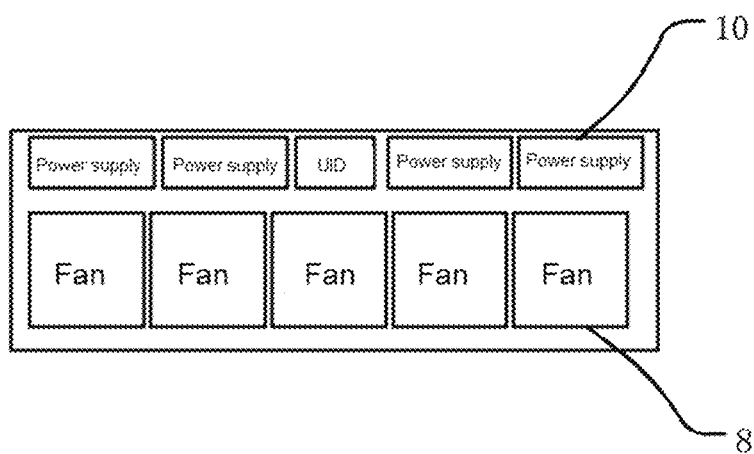
FIG. 8 is a right view of the architecture of an I/O server according to an embodiment of the disclosure.

As shown in FIGS. 7, 8 and 9, an uppermost layer is a computing layer 3, an intermediate layer is a threading layer 2, and a PCIE module layer 1 is provided at a bottom layer.

As shown in FIGS. 5, 6 and 9, after the power supply unit 10 (PSU) is provided on the computing layer 3, a PSU air guide hood 7 is designed on two sides of the mainboard 9, and cold air is transported for a power supply unit 10 (PSU) by means of a cold air channel formed by the PSU air guide hood 7.

The PCIE module layer 1 of the bottom layer is provided with a PCIE module installing area 111 and a fan installing area 112. The PCIE module installing area 111 forms an enclosed cavity in which a passive heat dissipation PCIE card 702 or an active heat dissipation PCIE card 701 is able to be mounted. The PCIE modules 7 are arranged to be aligned with each other, cold air enters the cavity from the front end of the chassis architecture, and hot air is discharged from the rear end of the chassis architecture. The same chassis architecture is compatible with both the passive heat dissipation PCIE card 702 and the active heat dissipation PCIE card 701, and an air guide hood 73 needs to be installed at the rear end of the passive heat dissipation PCIE card 702, thereby preventing the hot air coming out of the passive heat dissipation PCIE card 702 from flowing back.

In an embodiment, the PCIE module 7 is designed with an end blocking plate 71, a riser card bracket 74 and a card tail fixing support 72; a handle 712 is designed on the end blocking plate 71; a short-circuit-proof and scratch-proof mylar 76 is provided on the riser card 75; a tool-free knurled screw 721 is designed on the card tail fixing support 72; the riser card 75 fixing bracket separates the cables of the upper and lower riser cards 75 from each other, so as to prevent the riser card 75 and the cables from being scraped and damaged when the cables are assembled and disassembled, improving the operational experience.

Each of the plurality of PCIE module fixing slots is designed with a baffle 15 (PCIE Dummy) without tools, and the baffle 15 is able to be installed to a corresponding slot as required, thereby reducing ineffective air flows and enhancing EMC protection.

A fixing tray 20 which is maintained without tools is designed in the middle layer, for fixing a PCIE cable connected to the PCIE module 7. The PCIE cable includes a signal cable and a power supply cable. A temporary cable storage structure 22 is designed on the fixing tray 20. The temporary cable storage structure 22 is configured for assisting a person to complete wiring of the PCIE module 7 and disassembly and assembly of the computing layer 3.

The flexible seals 5 such as windproof foams and fur brushes are designed at threading positions of the fixing tray 20 and the computing layer 3, to form a closed cavity together with the baffle 15, so that the independence of the air duct between the computing layer 3 and the closed cavity is ensured, to avoid the generation of ineffective air flows.

In the chassis architecture, the PCIE cable connected to the PCIE module 7 is borne by adding the threading layer 2 between the computing layer 3 and the PCIE module layer 1, so that in a installing process, a threading operation may be completed by fixing the PCIE cables to the threading layer 2, then arranging the computing layer 3 and extending the PCIE cables to a mainboard installing area 31 and/or a power supply installing area 32 on the computing layer 3 simply by one person, thereby reducing manpower requirements and facilitating the operation. Moreover, the upper surface of the threading layer 2 is configured for bearing the PCIE cables, so that a plurality of PCIE modules 7 are able to be arranged in one row, and thus each PCIE module 7 may meet the heat dissipation requirement thereof.

Embodiment 2

Based on the same inventive concept as Embodiment 1, as shown in FIGS. 6, 7 and 9, embodiment 2 provides a chassis architecture, including a PCIE module layer 1, a threading layer 2, and a computing layer 3. The chassis architecture is applicable to servers.

As shown in FIGS. 7, 8 and 9, an uppermost layer is a computing layer 3, an intermediate layer is a threading layer 2, and a PCIE module layer 1 is provided at a bottom layer.

As shown in FIGS. 5, 9, 10, 11, 12, 13, 14 and 15, the PCIE module layer 1 includes a bottom plate 11 and two side plates 12 connected to two sides of the bottom plate 11; a PCIE module installing area 111 and a fan installing area 112 are respectively provided at two ends of the bottom plate 11 in an extending direction of the bottom plate, and the PCIE module installing area 111 is configured for accommodating a plurality of PCIE modules 7; the threading layer 2 is provided above the PCIE module layer 1 and correspond to the PCIE module installing area 111, two sides of the threading layer 2 is connected to the two side plates 12, the threading layer 2 is provided with a plurality of first threading holes 21, the plurality of first threading holes 21 being configured for allowing a passage of a PCIE cable connected to the plurality of PCIE modules 7, and an upper surface of the threading layer 2 is configured for bearing the PCIE cable; the computing layer 3 is provided above the threading layer 2, two sides of the computing layer 3 are connected to the two side plates 12, the computing layer 3 is provided with a mainboard installing area 31 and a power supply installing area 32; the computing layer 3 is provided with a plurality of second threading holes 33; and the plurality of second threading holes 33 are configured for allowing a passage of the PCIE cable, so that the PCIE cable extends to the mainboard installing area 31 and/or the power supply installing area 32.

The PCIE cables include signal cables and power supply cables.

As shown in FIG. 9, the chassis architecture includes: an upper cover 4 connected above the computing layer 3.

As shown in FIG. 14, in the present embodiment, the threading layer 2 includes a fixing tray 20, the fixing tray 20 is parallel to the bottom plate 11, and two sides of the fixing tray 20 are connected to the two side plates 12 by clamping.

Figure 15:
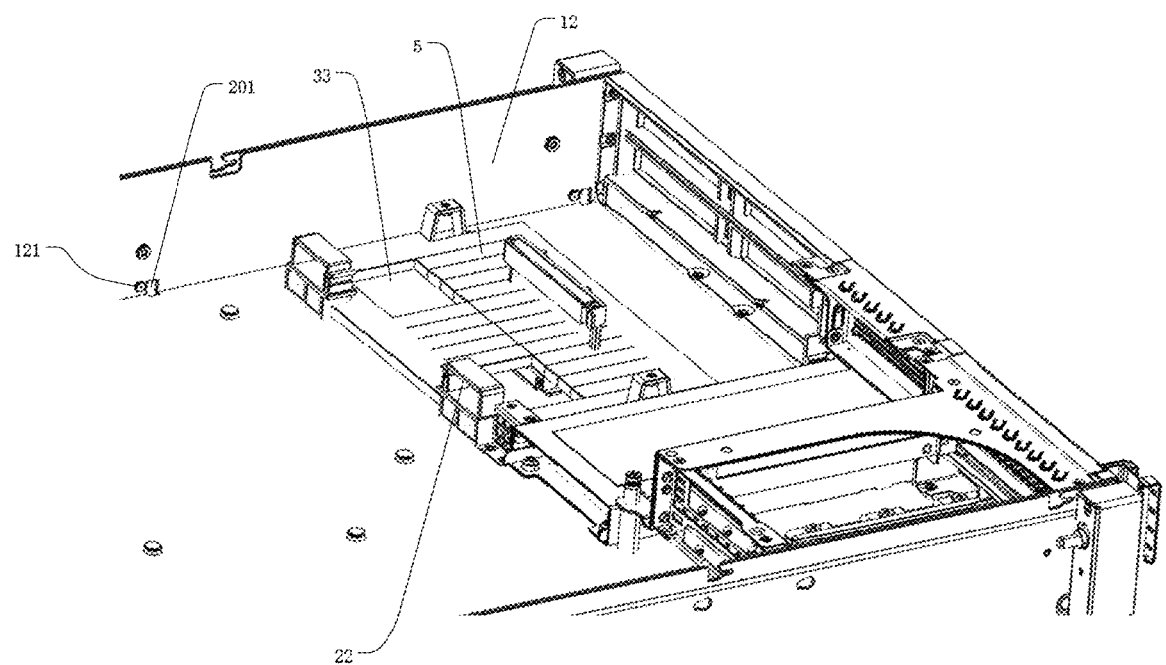
FIG. 15 is a partial schematic structural diagram of a computing layer according to an embodiment of the disclosure.

As shown in FIG. 15, in the present embodiment, two sides of the fixing tray 20 are provided with L-shaped grooves 201; the two side plates 12 are provided with I-shaped nail I-shaped nails 121, and the L-shaped grooves 201 are fitted with the I-shaped nail I-shaped nails 121.

As shown in FIG. 14, in the present embodiment, the fixing tray 20 includes two first threading holes 21 parallel to each other, and an extending direction of each of the plurality of first threading holes 21 is perpendicular to an extending direction of the bottom plate 11.

As shown in FIG. 14, in the present embodiment, temporary cable storage structures 22 are provided at two sides of each of the plurality of first threading holes 21, and/or temporary cable storage structures 22 are provided on the fixing tray 20 at a position corresponding to the plurality of second threading holes 33, and the temporary cable storage structures 22 include cable clamps.

As shown in FIGS. 9, 10, 14 and 15, in the present embodiment, the edges of each of the plurality of first threading holes 21 are provided with flexible seals 5 extending to the central position of the plurality of first threading holes 21, and gaps between the flexible seals 5 pass through the PCIE cables; and the flexible seals 5 include a foam strip, a fur brush, a rubber block or an elastic fabric strip.

As shown in FIGS. 11, 13, 19, 20 and 21, in the present embodiment, the PCIE module layer 1 further includes an external outer end plate 13 and an inner end plate 14 that are located at two sides of the PCIE module installing area 111, the bottom edges of the external outer end plate 13 and the inner end plate 14 are both connected to the bottom plate 11, and two ends of the external outer end plate 13 and two ends of the inner end plate 14 are both connected to the two side plates 12, a top edge of the external outer end plate 13 is connected to the computing layer 3, and a top edge of the inner end plate 14 is connected to the threading layer 2, so that the PCIE module installing area 111 between the threading layer 2 and the bottom plate 11 forms a closed cavity.

As shown in FIGS. 11, 13, 19, 20 and 21, in the present embodiment, the external outer end plate 13 is provided with a connection port 131 corresponding to each of the plurality of PCIE module fixing slots; each of the connection ports 131 is able to snap-fit a baffle 15 or snap-fit an end blocking plate 71 of the PCIE module 7; and the inner end plate 14 is provided with snap-fit ports 141 which are arranged in a one-to-one correspondence with the connection ports 131.

As shown in FIGS. 19, 20 and 21, in the present embodiment, the plurality of PCIE modules 7 include an active heat dissipation PCIE card 701 and a passive heat dissipation PCIE card 702, wherein the PCIE modules that actively dissipate heat carry a heat dissipation fan, while the PCIE modules that passively dissipate heat is provided with an on-board radiator to assist in dissipating heat. Two ends of each of the plurality of PCIE modules 7 are respectively provided with an end blocking plate 71 and a card tail fixing support 72.

In an embodiment, the passive heat dissipation PCIE card 702 is provided adjacent to the external outer end plate 13, and the active heat dissipation PCIE card 701 is provided adjacent to the inner end plate 14.

As shown in FIGS. 19, 20 and 21, in an embodiment, the passive heat dissipation PCIE card 702 is provided in the PCIE module fixing slot, the connection port 131 accommodates the end blocking plate 71 of the passive heat dissipation PCIE card 702.

As shown in FIG. 19, in another embodiment, no passive heat dissipation PCIE card 702 is provided in the PCIE module fixing slot, a baffle 15 is snap-fitted to the connection port 131 corresponding to the PCIE module fixing slot.

As shown in FIG. 20, in another embodiment, the active heat dissipation PCIE card 701 is provided in the PCIE module fixing slot, the active heat dissipation PCIE card 701 and the connection port 131 corresponding to the PCIE module fixing slot are arranged at intervals, a baffle 15 is snap-fitted to the connection port 131, an air inlet hole is provided on the baffle 15, and the snap-fit port 141 fixes the card tail fixing support 72 of the active heat dissipation PCIE card 701.

As shown in FIG. 20, in another embodiment, no PCIE module 7 is provided in the PCIE module fixing slot, a baffle 15 is snap-fitted to both the connection port 131 and the snap-fit port 141 corresponding to the PCIE module fixing slot.

As shown in FIGS. 20 and 21, in the present embodiment, the chassis architecture includes an air guide hood 73, and when both the active heat dissipation PCIE card 701 and the passive heat dissipation PCIE card 702 are provided in the PCIE module fixing slot in the PCIE module installing area 111, the air guide hood 73 is provided between a card tail fixing support 72 of the passive heat dissipation PCIE card 702 and the snap-fit port 141.

As shown in FIG. 15, in the present embodiment, two sides of the computing layer 3 are provided with L-shaped grooves 201; the two side plates 12 are provided with I-shaped nails 121, and the L-shaped grooves 201 are fitted with the I-shaped nails 121.

As shown in FIG. 5, in the present embodiment, the computing layer 3 is provided with an I/O module installing area 34; the I/O module installing area 34 is located on a side of the mainboard installing area 31 away from the power supply installing area 32; a second threading hole 33 is provided between the I/O module installing area 34 and the mainboard installing area 31; and a second threading hole 33 is provided between the mainboard installing area 31 and the power supply installing area 32.

As shown in FIG. 9, in the present embodiment, the chassis architecture includes a PSU air guide hood 6, and cold air is transported for a power supply unit 10 (PSU) by means of a cold air channel formed by the PSU air guide hood 6.

In the chassis architecture, the PCIE cable connected to the PCIE module 7 is borne by adding the threading layer 2 between the computing layer 3 and the PCIE module layer 1, so that in a installing process, a threading operation may be completed by fixing the PCIE cables to the threading layer 2, then arranging the computing layer 3 and extending the PCIE cables to a mainboard installing area 31 and/or a power supply installing area 32 on the computing layer 3 simply by one person, thereby reducing manpower requirements and facilitating the operation. Moreover, the upper surface of the threading layer 2 is configured for bearing the PCIE cables, so that a plurality of PCIE modules 7 is able to be arranged in one row, and thus each of plurality of PCIE modules 7 may meet the heat dissipation requirement thereof.

Embodiment 3

As shown in FIGS. 5, 6, 7, 8 and 9, embodiment 3 provides a server, including the chassis architecture. In an embodiment, the server is an I/O type server.

As shown in FIGS. 6, 7 and 9, the chassis architecture includes: a PCIE module layer 1, a threading layer 2 and a computing layer 3. As shown in FIGS. 7, 8 and 9, an uppermost layer is a computing layer 3, an intermediate layer is a threading layer 2, and a PCIE module layer 1 is provided at a bottom layer.

As shown in FIGS. 5, 9, 10, 11, 12, 13, 14 and 15, the PCIE module layer 1 includes a bottom plate 11 and two side plates 12 connected to two sides of the bottom plate 11; a PCIE module installing area 111 and a fan installing area 112 are respectively provided at two ends of the bottom plate 11 in an extending direction of the bottom plate, and the PCIE module installing area 111 is configured for accommodating a plurality of PCIE modules 7; the threading layer 2 is provided above the PCIE module layer 1 and correspond to the PCIE module installing area 111, two sides of the threading layer 2 is connected to the two side plates 12, the threading layer 2 is provided with a plurality of first threading holes 21, the plurality of first threading holes 21 being configured for allowing the passage of a PCIE cable connected to the plurality of PCIE modules 7, and an upper surface of the threading layer 2 is configured for bearing the PCIE cable; the computing layer 3 is provided above the threading layer 2, two sides of the computing layer 3 are connected to the two side plates 12, the computing layer 3 is provided with a mainboard installing area 31 and a power supply installing area 32; the computing layer 3 is provided with a plurality of second threading holes 33; and the plurality of second threading holes 33 are configured for allowing the passage of the PCIE cable, so that the PCIE cable extends to the mainboard installing area 31 and/or the power supply installing area 32.

The PCIE cables include signal cables and power supply cables.

As shown in FIG. 9, the chassis architecture includes: an upper cover 4 connected above the computing layer 3.

As shown in FIG. 14, in the present embodiment, the threading layer 2 includes a fixing tray 20, the fixing tray 20 is parallel to the bottom plate 11, and two sides of the fixing tray 20 are connected to the two side plates 12 by clamping.

As shown in FIG. 15, in the present embodiment, two sides of the fixing tray 20 are provided with L-shaped grooves 201; the two side plates 12 are provided with I-shaped nail I-shaped nails 121, and the L-shaped grooves 201 are fitted with the I-shaped nail I-shaped nails 121.

As shown in FIG. 14, in the present embodiment, the fixing tray 20 includes two first threading holes 21 parallel to each other, and an extending direction of each of the plurality of first threading holes 21 is perpendicular to the extending direction of the bottom plate 11.

As shown in FIG. 14, in the present embodiment, temporary cable storage structures 22 are provided at two sides of each of plurality of first threading holes 21, and/or temporary cable storage structures 22 are provided on the fixing tray 20 at a position corresponding to the plurality of second threading holes 33, and the temporary cable storage structures 22 include cable clamps.

As shown in FIGS. 9, 10, 14 and 15, in the present embodiment, the edges of each of the plurality of first threading holes 21 are provided with flexible seals 5 extending to the central position of the plurality of first threading holes 21, and gaps between the flexible seals 5 pass through the PCIE cables; and the flexible seals 5 include a foam strip, a fur brush, a rubber block or an elastic fabric strip.

As shown in FIGS. 11, 13, 19, 20 and 21, in the present embodiment, the PCIE module layer 1 further includes an external outer end plate 13 and an inner end plate 14 that are located at two sides of the PCIE module installing area 111, the bottom edges of the external outer end plate 13 and the inner end plate 14 are both connected to the bottom plate 11, and two ends of the external outer end plate 13 and two ends of the inner end plate 14 are both connected to the two side plates 12, a top edge of the external outer end plate 13 is connected to the computing layer 3, and a top edge of the inner end plate 14 is connected to the threading layer 2, so that the PCIE module installing area 111 between the threading layer 2 and the bottom plate 11 forms a closed cavity.

As shown in FIGS. 11, 13, 19, 20 and 21, in the present embodiment, the external outer end plate 13 is provided with a connection port 131 corresponding to each of the plurality of PCIE module fixing slots; each of the connection ports 131 is able to snap-fit a baffle 15 or snap-fit an end blocking plate 71 of the PCIE module 7; and the inner end plate 14 is provided with snap-fit ports 141 which are arranged in a one-to-one correspondence with the connection ports 131.

As shown in FIGS. 19, 20 and 21, in the present embodiment, the plurality of PCIE modules 7 include an active heat dissipation PCIE card 701 and a passive heat dissipation PCIE card 702, wherein the PCIE modules that actively dissipate heat carry a heat dissipation fan, while the PCIE modules that passively dissipate heat is provided with an on-board radiator to assist in dissipating heat. Two ends of each of the plurality of PCIE modules 7 are respectively provided with an end blocking plate 71 and a card tail fixing support 72.

In an embodiment, the passive heat dissipation PCIE card 702 is provided adjacent to the external outer end plate 13, and the active heat dissipation PCIE card 701 is provided adjacent to the inner end plate 14.

As shown in FIGS. 19, 20 and 21, in an embodiment, the passive heat dissipation PCIE card 702 is provided in the PCIE module fixing slot, the connection port 131 accommodates the end blocking plate 71 of the passive heat dissipation PCIE card 702.

As shown in FIG. 19, in another embodiment, no passive heat dissipation PCIE card 702 is provided in the PCIE module fixing slot, a baffle 15 is snap-fitted to the connection port 131 corresponding to the PCIE module fixing slot.

As shown in FIG. 20, in another embodiment, the active heat dissipation PCIE card 701 is provided in the PCIE module fixing slot, the active heat dissipation PCIE card 701 and the connection port 131 corresponding to the PCIE module fixing slot are arranged at intervals, a baffle 15 is snap-fitted to the connection port 131, an air inlet hole is provided on the baffle 15, and the snap-fit port 141 fixes the card tail fixing support 72 of the active heat dissipation PCIE card 701.

As shown in FIG. 20, in another embodiment, no PCIE module 7 is provided in the PCIE module fixing slot, a baffle 15 is snap-fitted to both the connection port 131 and the snap-fit port 141 corresponding to the PCIE module fixing slot.

As shown in FIGS. 20 and 21, in the present embodiment, the chassis architecture includes an air guide hood 73, and when both the active heat dissipation PCIE card 701 and the passive heat dissipation PCIE card 702 are provided in the PCIE module fixing slot in the PCIE module installing area 111, the air guide hood 73 is provided between a card tail fixing support 72 of the passive heat dissipation PCIE card 702 and the snap-fit port 141.

As shown in FIG. 15, in the present embodiment, two sides of the computing layer 3 are provided with L-shaped grooves 201; the two side plates 12 are provided with I-shaped nails 121, and the L-shaped grooves 201 are fitted with the I-shaped nails 121.

As shown in FIG. 5, in the present embodiment, the computing layer 3 is provided with an I/O module installing area 34; the I/O module installing area 34 is located on a side of the mainboard installing area 31 away from the power supply installing area 32; a second threading hole 33 is provided between the I/O module installing area 34 and the mainboard installing area 31; and a second threading hole 33 is provided between the mainboard installing area 31 and the power supply installing area 32.

As shown in FIG. 9, in the present embodiment, the chassis architecture includes a PSU air guide hood 6, and cold air is transported for a power supply unit 10 (PSU) by means of a cold air channel formed by the PSU air guide hood 6.

As shown in FIG. 9, in the present embodiment, the server includes: the plurality of PCIE modules 7, provided in the PCIE module installing area 111 of a PCIE module layer 1; fan modules 8, provided in a fan PCIE module installing area 112 of the PCIE module layer 1; a mainboard 9, provided in the mainboard installing area 31 of the computing layer 3; a power supply unit 10, provided in the power supply installing area 32 of the computing layer 3; a PCIE cable, one end of which is electrically connected to the PCIE module 7, and the other end of which passes through the plurality of first threading holes 21 of the threading layer 2, then extends along an upper surface of the threading layer 2 and passes through the plurality of second threading holes 33 of the computing layer 3 to be electrically connected to the mainboard 9 or the power supply unit 10; and a fan wiring, one end of which is electrically connected to the power supply unit 10, and the other end of which passes through the second threading holes 33 of the computing layer 3 and is electrically connected to the mainboard 9 or the power supply unit 10.

As shown in FIGS. 5, 10, 12, 14 and 15, in the present embodiment, the server includes: an I/O module provided in the I/O module installing area 34 of the PCIE module layer 1, the I/O module installing area 34 being located on the side of the mainboard installing area 31 away from the power supply installing area 32; a second threading hole 33 is provided between the I/O module installing area 34 and the mainboard installing area 31, and a second threading hole 33 is provided between the mainboard installing area 31 and the power supply installing area 32.

As shown in FIGS. 19, 20 and 21, in the present embodiment, the plurality of PCIE modules 7 are aligned with each other in the PCIE module mounting area 111; and the PCIE plurality of module 7 include a Graphic Processing Unit (GPU) card, a Field Programmable Gate Array (FPGA) card, and an encryption card.

As shown in FIGS. 16, 17 and 18, in the present embodiment, each of the plurality of PCIE modules 7 includes a fixed housing 70, and an end blocking plate 71 and a card tail fixing support 72 that are connected to two ends of the fixed housing 70; the end blocking plate 71 is provided with positioning pins 711 and a handle 712; each of the positioning pins is in positioning snap-fit with a snap-fit port of the PCIE module mounting area 111 (the chassis panel or the cross beam); the handle 712 is rotatably provided on the top of the end blocking plate 71; the bottom of the card tail fixing support 72 is provided with a knurled screw 721, and the knurled screw 721 is in threaded connection with a threaded hole of the PCIE module mounting area 111. The knurled screw 721 is configured in cooperation with the positioning pin. The positioning pin is first in positioning snap-fit with a snap-fit port of the PCIE module mounting area 111 (the chassis panel or the cross beam), and then the knurled screw 721 may be manually rotated to position and install the PCIE module 7 without tools, and the operation is convenient.

As shown in FIGS. 16, 17 and 18, in the present embodiment, each of the plurality of PCIE modules includes: a riser card bracket 74, the riser card bracket 74 being provided at a position of an outer side wall of the PCIE module 7, two ends of the riser card bracket being respectively fixed to the end blocking plate 71 and the card tail fixing support 72; in an embodiment, two PCIE modules 7 are adjacently arranged, the two riser card brackets 74 are arranged up and down in a staggered manner; a riser card 75, provided on the riser card bracket 74; and a Mylar 76, provided on the side of the riser card 75 away from the riser card bracket 74.

The mylar 76 is arranged on the side of the riser card 75 away from the riser card bracket 74 by means of adhesive bonding, and has anti-short circuit and anti-scratch functions.

As shown in FIGS. 17 and 18, in the present embodiment, the riser card bracket 74 is L-shaped; the riser card bracket 74 includes a fixing plate 741 and a wire separation plate 742 that are provided perpendicular to each other; the fixing plate 741 is arranged parallel to an outer side wall of the PCIE module 7; the wire separation plate 742 is arranged perpendicular to the outer side wall of the PCIE module 7; in an embodiment, two PCIE modules 7 are arranged adjacent to each other, two wire separation plates 742 are arranged parallel to each other vertically; and cables connected to the riser card 75 are arranged on the side of the two wire separation plates 742 facing away from each other. The riser card 75 fixing support separates cables of the upper and lower riser cards 75, so as to prevent the riser card 75 and the cables from being scraped and damaged when the cables are disassembled and assembled, thereby improving the operational experience.

As shown in FIG. 6, in the present embodiment, the fan module 8 includes a fan backplate 81 and a fan unit 82; the power supply unit 10 includes a power supply board 101 and a power supply unit 102; the PCIE cable is electrically connected to the power supply board 101; the fan wiring is electrically connected between the fan backplate 81 and the mainboard 9, and/or the fan wiring is electrically connected between the fan backplate 81 and the power supply board 101.

The PCIE module installing area 111 of the lower PCIE module layer 1 at a bottom layer forms an enclosed cavity in which a passive heat dissipation PCIE card 702 or an active heat dissipation PCIE card 701 is able to be mounted. The PCIE modules 7 are aligned with each other, cold air enters the cavity from the front end of the chassis architecture, and hot air is discharged from the rear end of the chassis. The chassis architecture is compatible with both the passive heat dissipation PCIE card 702 and the active heat dissipation PCIE card 701, and an air guide hood 73 needs to be installed at the rear end of the passive heat dissipation PCIE card 702, thereby preventing the hot air coming out of the passive heat dissipation PCIE card 702 from flowing back.

In conclusion, the computing layer 3 includes the I/O module of the front window, the mainboard 9 in the middle, and the power supply unit 10 (PSU), the PSU air guide hood 6, and the unique identifier (UID) of the rear window.

The PCIE module 7 is designed with an end blocking plate 71, a riser card bracket 74 and a card tail fixing support 72; a handle 712 is designed on the end blocking plate 71; a short-circuit-proof and scratch-proof mylar 76 is provided on the riser card 75; knurled screws 721 without tools are designed on the card tail fixing support 72; the riser card 75 fixing bracket separates the cables of the upper and lower riser cards 75 from each other, so as to prevent the riser card 75 and the cables from being scraped and damaged when the cables are assembled and disassembled, improving the operational experience.

Each of the plurality of PCIE module fixing slots is designed with a baffle 15 (PCIE Dummy) without tools, and the baffle 15 is installed to a corresponding slot as required, thereby reducing ineffective air flows and enhancing EMC protection.

The fixing tray 20 which is maintained without tools is designed in the intermediate layer, for fixing a PCIE cable connected to the plurality of PCIE modules 7. The PCIE cable includes a signal cable and a power supply cable. A temporary cable storage structure 22 is designed on the fixing tray 20. The temporary cable storage structure 22 is configured for assisting a person to complete wiring of the plurality of PCIE modules 7 and disassembly and assembly of the computing layer 3.

The flexible seals 5 such as windproof foams and fur brushes are designed at threading positions of the fixing tray 20 and the computing layer 3, to form a closed cavity together with the baffle 15, so that the independence of the air duct between the computing layer 3 and the closed cavity is ensured, to avoid the generation of ineffective air flows.

In the server, the PCIE cable connected to the plurality of PCIE modules 7 is borne by adding the threading layer 2 between the computing layer 3 and the PCIE module layer 1, so that in a installing process, a threading operation may be completed by fixing the PCIE cables to the threading layer 2, then arranging the computing layer 3 and extending the PCIE cables to a mainboard installing area 31 and/or a power supply installing area 32 on the computing layer 3 simply by one person, thereby reducing manpower requirements and facilitating the operation. Moreover, the upper surface of the threading layer 2 is configured for bearing the PCIE cables, so that a plurality of PCIE modules 7 may be arranged in one row, and thus each PCIE module 7 may meet the heat dissipation requirement thereof.

For a specific limitation of the server, reference may be made to the foregoing limitation on the chassis architecture, and details are not repeatedly described herein.

Various technical features of the described embodiments may be combined in any way, and in order to make the description brief, all possible combinations of the technical features of the described embodiments are not described. However, as long as the combination of these technical features is not contradictory, all of the technical features should be considered to belong to the scope of the description.

The described embodiments merely represent several embodiments of the disclosure, and the description thereof is specific and detailed, but the specific and detailed description may not be understood as limiting the patent scope of the disclosure. It should be noted that for a person of ordinary skill in the art, several modifications and improvements may be made without departing from the concept of some embodiments of the present disclosure, and all these modifications and improvements belong to the scope of protection of some embodiments of the present disclosure. Therefore, the scope of protection of the disclosure patent shall be subject to the appended claims.

What is claimed is:

1. A chassis architecture, comprising:
   a PCIE (Peripheral Component Interface Express) module layer, comprising a bottom plate and two side plates connected to two sides of the bottom plate, a PCIE module installing area and a fan installing area being respectively provided at two ends of the bottom plate in an extending direction of the bottom plate, and the PCIE module installing area being configured for accommodating a plurality of PCIE modules;
   a threading layer, provided above the PCIE module layer and corresponding to the PCIE module installing area, two sides of the threading layer being connected to the two side plates, the threading layer being provided with a plurality of first threading holes, the plurality of first threading holes being configured for allowing a passage of a PCIE cable connected to the plurality of PCIE modules, and an upper surface of the threading layer being configured for bearing the PCIE cable; and
   a computing layer, provided above the threading layer, two sides of the computing layer being connected to the two side plates, the computing layer being provided with a mainboard installing area and a power supply installing area, the computing layer being provided with a plurality of second threading holes, and the plurality of second threading holes being configured for allowing the passage of the PCIE cable, so that the PCIE cable extends to the mainboard installing area and/or the power supply installing area.

2. The chassis structure as claimed in claim 1, wherein the threading layer comprises a fixing tray, the fixing tray is parallel to the bottom plate, and two sides of the fixing tray are connected to the two side plates by clamping.

3. The chassis architecture as claimed in claim 2, wherein two sides of the fixing tray are provided with L-shaped grooves; the two side plates are provided with I-shaped nails, and the L-shaped grooves are fitted with the I-shaped nails.

4. The chassis architecture as claimed in claim 1, wherein a fixing tray comprises two first threading holes parallel to each other, and an extending direction of the two first threading holes is perpendicular to the extending direction of the bottom plate.

5. The chassis architecture as claimed in claim 1, wherein temporary cable storage structures are provided at two sides of each of the plurality of first threading holes, and/or temporary cable storage structures are provided on a fixing tray at a position corresponding to each of the plurality of second threading holes, and the temporary cable storage structures comprise cable clamps.

6. The chassis architecture as claimed in claim 1, wherein edges of the plurality of first threading holes are provided with flexible seals extending to the central position of the plurality of first threading holes, and gaps between the flexible seals pass through the PCIE cable; and the flexible seals comprise a foam strip, a fur brush, a rubber block or an elastic fabric strip.

7. The chassis architecture as claimed in claim 1, wherein the PCIE module layer comprises an external outer end plate and an inner end plate that are located at two sides of the PCIE module installing area, bottom edges of the external outer end plate and the inner end plate are both connected to the bottom plate, and two ends of the external outer end plate and two ends of the inner end plate are both connected to the two side plates, a top edge of the external outer end plate is connected to the computing layer, and a top edge of the inner end plate is connected to the threading layer, so that the PCIE module installing area between the threading layer and the bottom plate forms a closed cavity.

8. The chassis architecture as claimed in claim 1, wherein a plurality of PCIE module fixing slots provided in parallel are provided in the PCIE module installing area, and each of the plurality of PCIE module fixing slots is arranged in an extending direction of the bottom plate and is capable of accommodating each of the plurality of PCIE modules, and all of the plurality of PCIE module fixing slots are aligned with each other in an extending direction perpendicular to the extending direction of the bottom plate.

9. The chassis architecture as claimed in claim 1, wherein an external outer end plate is provided with connection ports corresponding to each of a plurality of PCIE module fixing slots; each of the connection ports is able to snap-fit a baffle or snap-fit an end blocking plate of each of the plurality of PCIE modules; and an inner end plate is provided with snap-fit ports which are arranged in a one-to-one correspondence with the connection ports.

10. The chassis architecture as claimed in claim 1, wherein the plurality of PCIE modules comprise an active heat dissipation PCIE card and a passive heat dissipation PCIE card; two ends of each of the plurality of PCIE modules are respectively provided with an end blocking plate and a card tail fixing support;
   when the passive heat dissipation PCIE card is provided in a PCIE module fixing slot, a connection port accommodates the end blocking plate of the passive heat dissipation PCIE card;
   when no passive heat dissipation PCIE card is provided in a PCIE module fixing slot, a baffle is snap-fitted to a connection port corresponding to the PCIE module fixing slot;
   when the active heat dissipation PCIE card is provided in a PCIE module fixing slot, the active heat dissipation PCIE card and a connection port corresponding to the PCIE module fixing slot are arranged at intervals, a baffle is snap-fitted to the connection port, an air inlet hole is provided on the baffle, and a snap-fit port fixes the card tail fixing support of the active heat dissipation PCIE card; and
   when no PCIE module is provided in the PCIE module fixing slot, a baffle is snap-fitted to both the connection port and the snap-fit port corresponding to the PCIE module fixing slot.

11. The chassis architecture as claimed in claim 1, wherein the chassis architecture comprises an air guide hood, and when both an active heat dissipation PCIE card and a passive heat dissipation PCIE card are provided in a PCIE module fixing slot in the PCIE module installing area, the air guide hood is provided between a card tail fixing support of the passive heat dissipation PCIE card and a snap-fit port.

12. The chassis architecture as claimed in claim 1, wherein two sides of the computing layer are provided with L-shaped grooves, the two side plates are provided with I-shaped nails, and the L-grooves are fitted with the I-shaped nails.

13. The chassis architecture as claimed in claim 1, wherein the computing layer is provided with an I/O module installing area; the I/O module installing area is located on a side of the mainboard installing area away from the power supply installing area; a first one of the plurality of the second threading holes is provided between the I/O module installing area and the mainboard installing area; and a second one of the plurality of the second threading holes is provided between the mainboard installing area and the power supply installing area.

14. A server, comprising the chassis architecture as claimed in claim 1.

15. The server as claimed in claim 14, comprising:
the plurality of PCIE modules, provided in the PCIE module installing area of the PCIE module layer;
fan modules, provided in a fan PCIE module installing area of the PCIE module layer;
a mainboard, provided in the mainboard installing area of the computing layer;
a power supply unit, provided in the power supply installing area of the computing layer;
the PCIE cable, an end of which is electrically connected to the plurality of PCIE modules, and another end of which passes through the plurality of first threading holes of the threading layer, then extends along an upper surface of the threading layer and passes through the plurality of second threading holes of the computing layer to be electrically connected to the mainboard or the power supply unit; and
a fan wiring, an end of which is electrically connected to the power supply unit, and the other end of which passes through the plurality of second threading holes of the computing layer and is electrically connected to the mainboard or the power supply unit.

16. The server as claimed in claim 14, wherein the plurality of PCIE modules are aligned with each other in the PCIE module installing area; and the plurality of PCIE module comprise a graphic processing unit card, a field programmable gate array card, and an encryption card.

17. The server as claimed in claim 14, wherein each of the plurality of PCIE modules comprises a fixed housing, and an end blocking plate and a card tail fixing support that are connected to two ends of the fixed housing; the end blocking plate is provided with a positioning pin and a handle, the positioning pin is in positioning snap-fit with a snap-fit port of the PCIE module installing area; the handle is rotatably provided on a top of the end blocking plate; a bottom of the card tail fixing support is provided with a knurled screw, and the knurled screw is in threaded connection with a threaded hole of the PCIE module installing area.

18. The server as claimed in claim 14, wherein each of the plurality of PCIE modules comprises:
a riser card bracket, the riser card bracket being provided at a position of an outer side wall of each of the plurality of PCIE modules, two ends of the riser card bracket being respectively fixed to an end blocking plate and a card tail fixing support; when two PCIE modules are adjacently arranged, two riser card brackets are arranged up and down in a staggered manner;
a riser card, provided on the riser card bracket; and
a Mylar, provided on a side of the riser card away from the riser card bracket.

19. The server as claimed in claim 14, wherein the riser card bracket is L-shaped; the riser card bracket comprises a fixing plate and a wire separation plate that are provided perpendicular to each other; the fixing plate is arranged parallel to an outer side wall of each of the plurality of PCIE modules; the wire separation plate is arranged perpendicular to the outer side wall of each of the plurality of PCIE modules; when two PCIE modules are arranged adjacent to each other, two wire separation plates are arranged parallel to each other vertically; and cables connected to the riser card are arranged on a side of two wire separation plates facing away from each other.

20. The server as claimed in claim 14, wherein a fan module comprises a fan backplate and a fan unit; a power supply unit comprises a power supply board and a power supply unit; the PCIE cable is electrically connected to the power supply board; a fan wiring is electrically connected between a fan backplate and the mainboard, and/or a fan wiring is electrically connected between a fan backplate and a power supply board.

* * * * *